(12) United States Patent
Schuurmans

(10) Patent No.: US 8,687,821 B2
(45) Date of Patent: Apr. 1, 2014

(54) PLOP-FREE AMPLIFIER

(75) Inventor: Han Martijn Schuurmans, Cuijk (NL)

(73) Assignee: NXP B.V., Eindhoven (NL)

( * ) Notice: Subject to any disclaimer, the term of this patent is extended or adjusted under 35 U.S.C. 154(b) by 390 days.

(21) Appl. No.: 12/945,505

(22) Filed: Nov. 12, 2010

(65) Prior Publication Data

US 2011/0116653 A1   May 19, 2011

(30) Foreign Application Priority Data

Nov. 16, 2009 (EP) .................................. 09176061

(51) Int. Cl.
*H04B 15/00* (2006.01)

(52) U.S. Cl.
USPC ................ 381/94.5; 330/51; 330/98; 330/99; 330/100

(58) Field of Classification Search
USPC ............. 381/58, 59, 96, 120, 123, 156, 94.5; 330/51, 98, 99, 100
See application file for complete search history.

(56) References Cited

U.S. PATENT DOCUMENTS

| | | | | |
|---|---|---|---|---|
| 5,661,434 A | * | 8/1997 | Brozovich et al. | 330/51 |
| 6,538,590 B1 | * | 3/2003 | Gaboriau et al. | 341/152 |
| 6,597,650 B2 | * | 7/2003 | Katakura et al. | 369/59.22 |
| 2002/0011891 A1 | * | 1/2002 | Schuurmans et al. | 327/365 |
| 2002/0101282 A1 | * | 8/2002 | Iken | 330/51 |
| 2006/0182265 A1 | | 8/2006 | Sorace et al. | |
| 2006/0182266 A1 | | 8/2006 | Cusinato et al. | |
| 2007/0121962 A1 | | 5/2007 | Adachi et al. | |
| 2007/0139103 A1 | * | 6/2007 | Roeckner et al. | 330/10 |
| 2008/0049952 A1 | | 2/2008 | Jung et al. | |
| 2010/0128898 A1 | * | 5/2010 | Wong | 381/94.5 |

FOREIGN PATENT DOCUMENTS

| | | |
|---|---|---|
| JP | 54 083743 A | 7/1979 |
| WO | 2008/072212 A1 | 6/2008 |

OTHER PUBLICATIONS

Hank Zumbahlen, Linear Circuit Design Handbook, 2008, Chapter 1 (p. 1.20) and Chapter 2 (p. 2.105).*
Extended European Search Report for European Patent Appln. No. 09176061.1 (May 19, 2010)xxx.

\* cited by examiner

*Primary Examiner* — Vivian Chin
*Assistant Examiner* — William A Jerez Lora

(57) ABSTRACT

An amplifier is disclosed, wherein the output stage is split between a primary output stage and a secondary stage. To minimize or eliminate any audible plop when the amplifier is switched on, the primary stage is connected, and the second stage is gradually connected using a switch. The gradual connection can be by means of varying the pulse-density of a pulse wave modulation on the switch, from fully open (0% pulse-density) to fully closed (100%). The inverse process can minimize or eliminate plop during switch-off. Separate feedback loops are switchable, from the primary and secondary stages; in a DC-coupled embodiment, the feedback loop from the secondary stage may include DC-offset cancelling circuitry, to both reduce or eliminate the plop and avoid and DC-offset current through the speaker.

14 Claims, 2 Drawing Sheets

PLOP-FREE AMPLIFIER

This application claims the priority under 35 U.S.C. §119 of European patent application no. 09176061.1, filed on Nov. 16, 2009, the contents of which are incorporated by reference herein.

FIELD OF THE INVENTION

This invention relates to class AB amplifiers. It further relates to methods of controlling class AB amplifiers.

BACKGROUND OF THE INVENTION

Class AB amplifiers are typically used for providing the amplified output required for loudspeakers, for such applications as home entertainment systems. Usually, the loudspeaker (hereinafter also referred to as the speaker) is connected to the amplifier via a capacitor This is called AC-coupled, since the DC is blocked by the capacitor. The speaker can also be directly coupled to the speaker. This is called DC-coupled and requires a differential or true ground connection. The true ground connection requires negative voltages such that the amplifier output signals are referenced to 0V (ground).

A typical such AC-coupled amplifier arrangement is shown in FIG. 1. Speaker 11 is connected via capacitor 12 to the output of an operational amplifier 14, having a feedback loop via feedback resistor 15 to one (−) input of the operational amplifier. An input signal 16 is connected, via an input resistor 17, across the two inputs (− and +) of the operational amplifier. The amplifier is powered at the supply voltage Vdd, and the input (+) held at half the supply voltage (ie at ½Vdd).

When such an amplifier is switched on, the capacitor 12 will be charged until the voltage across it becomes ½Vdd. With a typical capacitor value of 220 µF and a speaker impedance of 8Ω, the charging (to 3τ) takes about 5.3 ms. This results in an audible plop from the speaker. Depending on the shape of the voltage curve across the speaker the timbre of the plop varies. When the shape has sharp edges, such as does a square wave, higher harmonics are present.

To date, conventional systems use a relay with the power amplifiers in order to reduce or eliminate the plop. However relays are bulky and heavy, and as such are particularly inconvenient for use with headphones or earphones and speakers.

United States patent application, publication number U2006/0182265, discloses an amplifier arrangement having a main output stage and a switchably connectable low output stage. A sample-and-hold circuit is used to control the main output stage to reduce the plop. A single feedback loop is provided to the low output stage.

SUMMARY OF INVENTION

In according with the invention, there is provided a class AB amplifier for a system having a speaker, the amplifier comprising an input (22), a primary output stage (24) having associated therewith a first feedback loop to the input (22), a secondary stage (23) having associated therewith a second feedback loop to the input, wherein the secondary stage is configured to be at least one of connectable gradually to the speaker upon switch-on of the system and disconnected gradually from the speaker upon switch-off of the system, and the primary output stage is respectively configured to be at least one of connected after the gradual connection of the secondary stage and disconnected before the gradual disconnection of the secondary stage. Thus the arrangement according to the invention allows for a "soft connection" of the amplifier to the speaker (or "soft disconnection", or both), thereby avoiding the plop known in the prior art.

In embodiments, the secondary stage is connectable to the speaker by a switch (26). The switch may be arranged to be operable by pulse width modulation (PWM) with variable mark-space ratio whereby the secondary stage (23) is connectable gradually upon switch-on to the speaker.

In embodiments, the input is connectable to either one of the first feedback loop and the second feedback loop by a feedback switch (25). Thus the primary and secondary stages can be separately controlled.

In embodiments, the amplifier is arranged for true ground operation, and the second feedback loop comprises a DC-offset cancelling unit (31). By controlling and cancelling any DC offset, DC current through the speaker, which results in power and efficiency losses and non-ideal operation of the speaker, can be controlled and even eliminated.

In embodiments, the DC-offset cancelling unit (31) comprises a series arrangement of a comparator (32), an integrator (33) and an amplifier (34).

According to another aspect of the invention, there is provided a method of controlling a class AB amplifier during switch-on, the amplifier having an input, a primary output stage having a first feedback loop switchably connectable to the input, and a secondary stage having a second feedback loop separately switchably connectable to the input, the method comprising connecting the second feed-back loop to the input gradually connecting the secondary stage to the speaker thereafter connecting the primary stage to the speaker, disconnecting the second feedback-loop and connecting the first feedback loop to the input. The gradual connection thus can reduce or eliminate audible plop.

In embodiments, gradually connecting the secondary stage to the speaker comprises applying a pulse wave modulation signal to the secondary stage, and varying the on-time of the pulse wave modulation signal from substantially 0% to substantially 100%.

According to a further aspect of the invention, there is provided a method of controlling a class AB amplifier during switch-off, the amplifier having an input, a primary output stage having a first feedback loop switchably connectable to the input, and a secondary stage having a second feedback loop separately switchably connectable to the input, the method comprising: disconnecting the primary stage to the speaker, disconnecting the first feedback-loop and connecting the second feedback loop to the input, and gradually disconnecting the secondary stage to the speaker. Thus the invention includes both switch-on and switch-off methods.

In embodiments gradually disconnecting the secondary stage to the speaker comprises applying a pulse wave modulation signal to the secondary stage, and varying the on-time of the pulse wave modulation signal from substantially 100% to substantially 0%.

In embodiments, the amplifier arrangement is a true ground arrangement, further comprising using the second feedback-loop to cancel DC-offset whilst the second feed-back loop is connected to the input.

In embodiments a feed-back signal in the second feedback loop is compared to ground, integrated and amplified.

These and other aspects of the invention will be apparent from, and elucidated with reference to, the embodiments described hereinafter.

BRIEF DESCRIPTION OF THE DRAWINGS

Embodiments of the invention will be described, by way of example only, with reference to the drawings, in which

FIG. 2 shows a schematic circuit diagram of an AC-coupled embodiment of the invention that.

Figure 1:
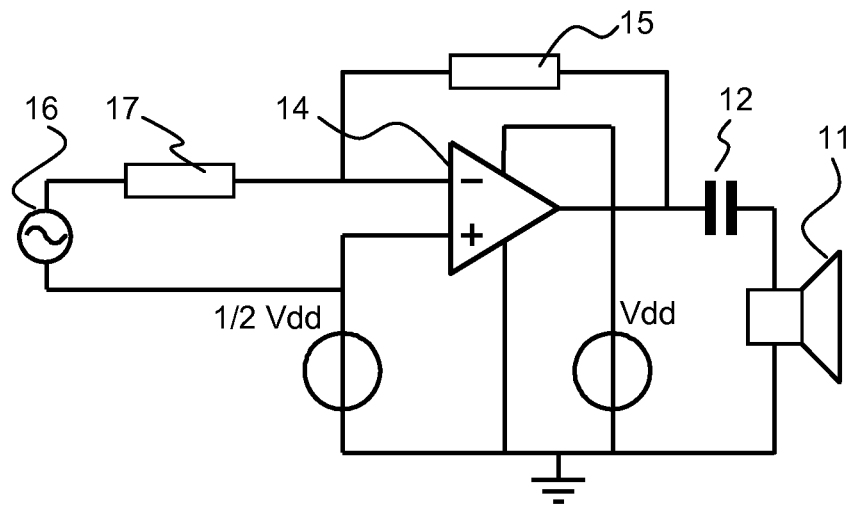
FIG. 1 shows a schematic circuit diagram of a class AB amplifier connected to a speaker.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar feature in modified and different embodiments

DETAILED DESCRIPTION OF EMBODIMENTS

Figure 2:
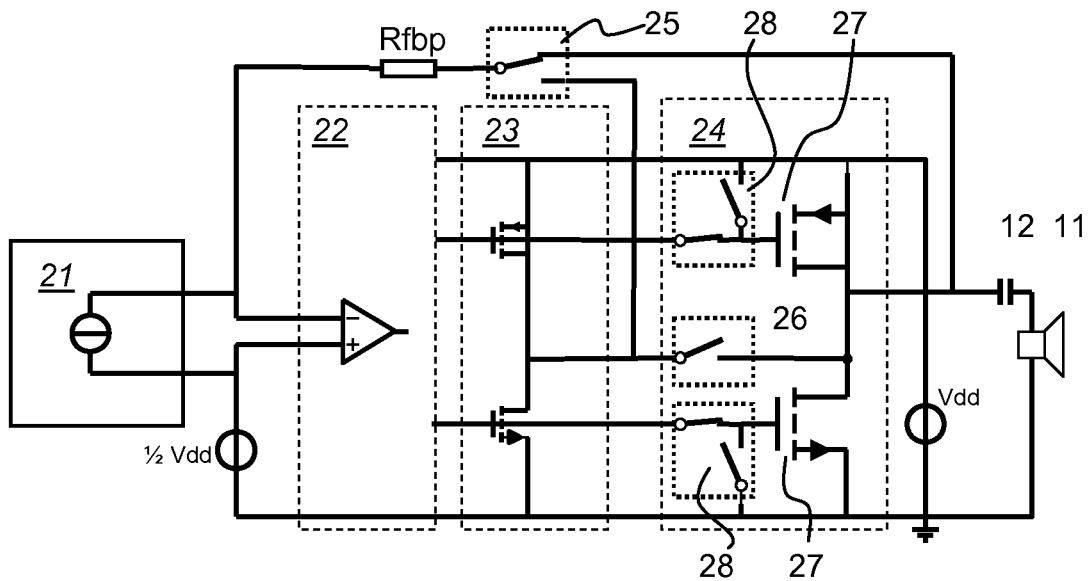

FIG. 2 shows a schematic circuit diagram of an amplifier arrangement according to an embodiment of the invention. In this embodiment, there is provided an AC coupled output stage.

The amplifier arrangement comprises a signal source 21, which is connected to an input and bias stage 22, and thence to the secondary stage 23 and primary output stage 24. The primary stage comprises a pair of transistors 27, and the secondary stage a pair of transistors 29. The output of primary output stage 24 is connected to speaker 11 via output capacitor 12. A switch 25 connects the feedback loop from either the secondary stage 23 or the primary output stage 24 to the input via feedback resistor Rfbp. The primary output stage includes a control switch 26, which switchably connects the output from the secondary stage 23 to the midpoint node between the two primary stage transistors 27. The gate controls of primary stage transistors 27 are respectively under the control of further switches 28.

In operation, the primary output stage is disabled by means of switches 28. The speaker can then be "soft connected", or gradually connected to the secondary stage to allow a slow charging the decoupling capacitor. Provided that this charging is sufficiently slow to fall outside the audio frequency band, a plop will not be audible in the speaker. In order to "soft connect" or gradually connect the secondary stage to the output, the switch 26 is gradually changed from an fully off state to a fully on state. The gradual change is effected by means of pulse width modulation (PWM) of the switch. As disclosed United States patent application, publication US-A-2002-011891, the full contents of which are incorporated herein by reference, the on-time of the PWM switch 26 is slowly changed from 0% to 100%; this can result in a relatively slow charging of the decoupling capacitor at a rate and shape that will not give an audible plop of the speaker. In the case that the shape has the form of a cosine curve from 0°-180°, a fast switch on (or, equivalently, switch-off) time can be realised without any audible plop. Once the secondary stage, speaker and decoupling capacitor settle, the primary stage can be enabled by turning on switches 28.

As shown in FIG. 2, there is separate feedback loop to the input, from each of the secondary stage 23 and the primary output stage 24. Switch 25 is used to select between these two feedback loops. When the primary output stage is enabled, the primary output is fed back to the input. However, during the transition stages, the secondary output is used as the feedback signal.

Figure 3:
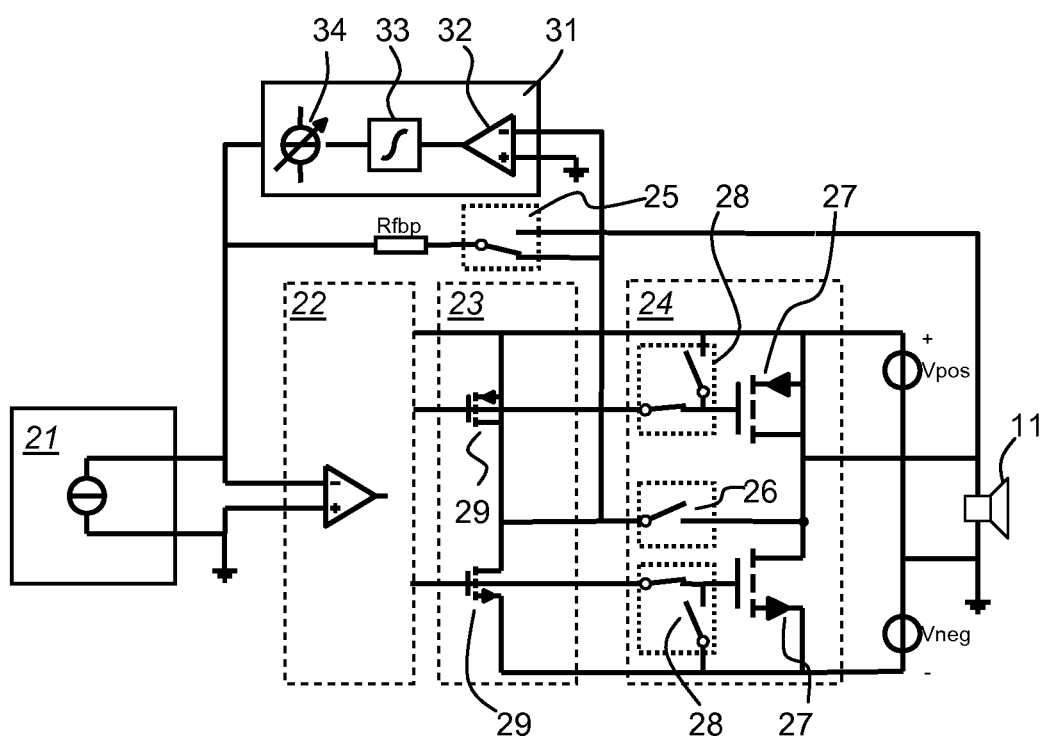
FIG. 3 shows a schematic circuit diagram of a further, DC-coupled, embodiment of the invention.

A further embodiment of the invention is shown schematically in FIG. 3. FIG. 3 shows a similar amplifier arrangement and that of FIG. 2, comprising an input and bias stage 22, a secondary stage 23 and a primary output stage 24. Corresponding elements to those of the previous embodiment are referenced by the same numeral. However, this embodiment differs from that shown previously in that it is a true ground configuration. In this arrangement, the speaker is DC coupled, and there is no requirement for an output decoupling capacitor 12. Instead, the speaker is coupled between the output of the primary output stage 24 and ground. Furthermore, the amplifier arrangement is balanced around ground, in the sense that, unlike the previous embodiment in which the amplifier was connected between a ground voltage and a supply rail Vdd, in this embodiment the amplifier is connected to a positive supply Vpos and negative supply Vneg. Although the invention is not limited thereto, in the case that Vpos is equal in value to Vneg (but opposite in sign), the amplifier arrangement is symmetrical about ground. Furthermore, the input and bias stage 22 is connected to ground rather than ½Vdd.

Amplifier arrangements with a true ground configuration, such as that shown in FIG. 3, can eventually suffer from the problem of a DC offset current through the speaker. When the speaker is switched on, not only does this result in an audible plop house already described, but the DC current flowing through the speaker produces a power loss. In the embodiment shown in FIG. 3, any DC offset may be cancelled by means of ADC offset cancelling arrangement 31. The DC offset can typically be caused by either (or both) a DC current in the signal source 21 and a DC offset of the amplifier input stage itself. A DC offset cancelling circuit 31 is able to remove this offset: the secondary output is compared with "true" ground by means of comparator 32. The error signal is filtered in integrator 33, amplified (at 34) and subtracted from the input, resulting in a reduction or removal of the DC offset. The DC offset cancelling circuit 31 can be implemented by entirely analog means, or by mixed signal with digital signal processing, using it ADC, the ADC and digital filtering for instance The remainder of the circuit shown in FIG. 3 operates in a similar way to the embodiment shown in FIG. 2: that is to say, during the switching on of the amplifier arrangement, the primary output stage 24 is disabled while the secondary stage is slowly turned on by means of PWM modulation of switch 26, the PWM modulation being gradually varied between 0% and 100% on time. Once the secondary stage is fully switched in, with switch 26 fully closed, the primary stage is enabled by means of switches 28.

In the above description, the embodiments have been described for switching on of the amplifier arrangement. However, the method also applies to plop free switch off of the amplifier arrangements, wherein firstly the primary output stage 24 is switched off by means of switches 28, and thereafter the secondary stage is gradually disabled by varying the pulse density, which is also known as the mark-space ratio, of variable PWM of switch 26.

Although in these embodiments, the input stage is shown as an input and bias stage 22, stage 22 may more generally consist of any suitable input.

In summary, from one viewpoint, then, an amplifier has been disclosed, wherein the output stage is split between a primary output stage and a secondary stage. To minimise or eliminate any audible plop when the amplifier is switched on, the primary stage is connected, and the second stage is gradually connected using a switch. The gradual connection can be by means of varying the pulse-density of a pulse wave modulation on the switch, from fully open (0% pulse-density) to fully closed (100%). The inverse process can minimise or eliminate plop during switch-off. Separate feedback loops are switchable, from the primary and secondary stages; in a DC-coupled embodiment, the feedback loop from the secondary stage may include DC-offset cancelling circuitry, to both reduce or eliminate the plop and avoid and DC-offset current through the speaker.

From reading the present disclosure, other variations and modifications will be apparent to the skilled person. Such variations and modifications may involve equivalent and other features which are already known in the art of class AB amplifiers, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub-combination.

The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The invention claimed is:

1. A class AB amplifier configured for true ground operation for a system having a DC-coupled speaker, the amplifier comprising:
    an input;
    a primary output stage having associated therewith a first feedback loop to the input; and
    a secondary stage having associated therewith a second feedback loop to the input, wherein the secondary stage is configured to be at least one of connectable gradually to the DC-coupled speaker upon switch-on of the system and disconnected gradually from the DC-coupled speaker upon switch-off of the system, and the primary output stage is respectively configured to be at least one of connected after the gradual connection of the secondary stage and disconnected before the gradual disconnection of the secondary stage.

2. The class AB amplifier according to claim 1, wherein the secondary stage is connectable to the DC-coupled speaker by a switch.

3. The class AB amplifier according to claim 2, wherein the switch is arranged to be operable with pulse width modulation with a variable mark-space ratio whereby the secondary stage is connectable gradually upon switch-on to the DC-coupled speaker.

4. The class AB amplifier according to claim 1, wherein the input is connectable to either the first feedback loop or the second feedback loop by a feedback switch.

5. The class AB amplifier according to claim 1, wherein the second feedback loop comprises a DC-offset cancelling unit.

6. The class AB amplifier according to claim 5, wherein the DC-offset cancelling unit comprises a series arrangement of a comparator, an integrator, and an amplifier.

7. A method of controlling a class AB amplifier configured for true ground operation during switch-on, the amplifier having an input, a primary output stage having a first feedback loop switchably connectable to the input, and a secondary stage having a second feedback loop separately switchably connectable to the input, the method comprising:
    connecting the second feedback loop to the input, gradually connecting the secondary stage to a DC-coupled speaker;
    and thereafter connecting the primary stage to the DC-coupled speaker;
    disconnecting the second feedback loop; and
    connecting the first feedback loop to the input.

8. The method of claim 7, wherein gradually connecting the secondary stage to the speaker comprises:
    applying a pulse wave modulation signal to the secondary stage; and
    varying on-time of the pulse wave modulation signal from substantially 0% to substantially 100%.

9. A method of controlling a class AB amplifier configured for true ground operation during switch-off, the amplifier having an input, a primary output stage having a first feedback loop switchably connectable to the input, and a secondary stage having a second feedback loop separately switchably connectable to the input, the method comprising:
    disconnecting, with a machine the primary stage to the DC-coupled speaker;
    disconnecting the first feedback-loop and connecting the second feedback loop to the input; and
    gradually disconnecting the secondary stage to the DC-coupled speaker.

10. The method of claim 9, wherein gradually disconnecting the secondary stage to the speaker comprises:
    applying a pulse wave modulation signal to the secondary stage; and
    varying on-time of the pulse wave modulation signal from substantially 100% to substantially 0%.

11. The method of claim 7, further comprising:
    using the second feedback loop to cancel DC-offset while the second feedback loop is connected to the input.

12. The method of claim 9, wherein a feedback signal in the second feedback loop is compared to ground, integrated, and amplified.

13. The class AB amplifier of claim 1, wherein the DC-coupled speaker is coupled between an output of the primary output stage and ground.

14. The class AB amplifier of claim 1, further comprising:
    a positive supply; and
    a negative supply, wherein the class AB amplifier is symmetrical about ground.

* * * * *